United States Patent
Burger et al.

(10) Patent No.: US 10,910,353 B2
(45) Date of Patent: Feb. 2, 2021

(54) WHITE LIGHT SOURCE AND METHOD OF PRODUCING A WHITE LIGHT SOURCE

(71) Applicant: OSRAM Opto Semiconductors GmbH, Regensburg (DE)

(72) Inventors: Markus Burger, Laaber (DE); Désirée Queren, Neutraubling (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/469,728

(22) PCT Filed: Dec. 14, 2017

(86) PCT No.: PCT/EP2017/082745
§ 371 (c)(1),
(2) Date: Jun. 14, 2019

(87) PCT Pub. No.: WO2018/114562
PCT Pub. Date: Jun. 28, 2018

(65) Prior Publication Data
US 2019/0319018 A1  Oct. 17, 2019

(30) Foreign Application Priority Data
Dec. 19, 2016 (DE) .................. 10 2016 124 873

(51) Int. Cl.
*H01L 25/075* (2006.01)
*H01L 33/50* (2010.01)

(52) U.S. Cl.
CPC ........ *H01L 25/0753* (2013.01); *H01L 33/504* (2013.01); *H01L 33/505* (2013.01); *H01L 33/508* (2013.01); *H01L 2933/0041* (2013.01)

(58) Field of Classification Search
None
See application file for complete search history.

(56) References Cited

U.S. PATENT DOCUMENTS 7,847,303 B2 * 12/2010 Jung ..................... F21V 7/26
257/89
2015/0171140 A1 6/2015 Sugizaki et al.
(Continued)

FOREIGN PATENT DOCUMENTS

DE 20 2015 103 835 U1 12/2015
EP 2 843 702 A1 3/2015

*Primary Examiner* — Dung A. Le
(74) *Attorney, Agent, or Firm* — DLA Piper LLP (US)

(57) ABSTRACT

A white light source includes an arrangement of light-emitting diodes, wherein the light-emitting diodes are subdivided into first light-emitting diodes and second light-emitting diodes, and a conversion element configured to absorb light emitted by the light-emitting diodes and generate converted light with a longer wavelength than the emitted light, wherein the conversion element includes a first luminescent conversion material in a first matrix material, the first matrix material with the first luminescent conversion material is arranged two-dimensionally in a continuous layer above the first and second light-emitting diodes, the conversion element includes a second luminescent conversion material in a second matrix material, and the second matrix material with the second luminescent conversion material is arranged only above the second light-emitting diodes.

18 Claims, 7 Drawing Sheets

(56) References Cited

U.S. PATENT DOCUMENTS

| | | | |
|---|---|---|---|
| 2015/0228629 A1 | 8/2015 | Tsai et al. | |
| 2016/0212804 A1 | 7/2016 | Peeters et al. | |
| 2016/0284950 A1* | 9/2016 | Tseng | H01L 33/504 |
| 2016/0351620 A1* | 12/2016 | Tanaka | H01L 33/50 |
| 2017/0005238 A1* | 1/2017 | Hung | H01L 21/561 |

* cited by examiner

| 115 | 116 | 113 | 113 |
|---|---|---|---|
| 111 | 112 | 111 | 112 |
| 111 | 112 | 111 | 112 |
| 111 | 112 | 111 | 112 |
| 111 | 112 | 111 | 112 |
| 113 | 113 | 115 | 116 |

| | 111 | 112 | 111 | 112 |
|---|---|---|---|---|
| 117 — | 111 | 112 | 111 | 112 |
| 118 — | 112 | 111 | 112 | 111 |
| 119 — | 111 | 112 | 111 | 112 |
| 120 — | 112 | 111 | 112 | 111 |

WHITE LIGHT SOURCE AND METHOD OF PRODUCING A WHITE LIGHT SOURCE

TECHNICAL FIELD

This disclosure relates to a white light source and a method of producing a white light source.

BACKGROUND

White light sources are required to illuminate objects with white light. For example, a scene intended to be recorded as photography, i.e., as an image, or as film, may be lit in white. Other applications may, for example, be illumination of a stage setting in a theater, illumination of a film scene during recording in a studio or in the open air, or illumination of a concert stage. In this example, a light color of the white light source is characteristic of a color impression created on the illuminated object. The color temperature is in this example commensurately higher when the blue component of the light emitted by the white light source is greater. White light sources with light-emitting diodes may be configured as light-emitting diodes having a luminescent conversion material. The combination of light-emitting diode emission and the nature of the light converted by the luminescent conversion material in this example establishes the color temperature.

There is nonetheless a need to provide an improved white light source and a method of producing such an improved white light source.

SUMMARY

We provide a white light source including an arrangement of light-emitting diodes, wherein the light-emitting diodes are subdivided into first light-emitting diodes and second light-emitting diodes, and a conversion element configured to absorb light emitted by the light-emitting diodes and generate converted light with a longer wavelength than the emitted light, wherein the conversion element includes a first luminescent conversion material in a first matrix material, the first matrix material with the first luminescent conversion material is arranged two-dimensionally in a continuous layer above the first and second light-emitting diodes, the conversion element includes a second luminescent conversion material in a second matrix material, and the second matrix material with the second luminescent conversion material is arranged only above the second light-emitting diodes.

We also provide a method of producing the white light source including an arrangement of light-emitting diodes, wherein the light-emitting diodes are subdivided into first light-emitting diodes and second light-emitting diodes, and a conversion element configured to absorb light emitted by the light-emitting diodes and generate converted light with a longer wavelength than the emitted light, wherein the conversion element includes a first luminescent conversion material in a first matrix material, the first matrix material with the first luminescent conversion material is arranged two-dimensionally in a continuous layer above the first and second light-emitting diodes, the conversion element includes a second luminescent conversion material in a second matrix material, and the second matrix material with the second luminescent conversion material is arranged only above the second light-emitting diodes, including providing an arrangement of light-emitting diodes, wherein the light-emitting diodes inside the arrangement are subdivided into first light-emitting diodes and into second light-emitting diodes; two-dimensional application of a first matrix material with a first luminescent conversion material onto the arrangement of light-emitting diodes; and application of a second matrix material with a second luminescent conversion material above the second light-emitting diodes.

We further provide a white light source including an arrangement of light-emitting diodes, wherein the light-emitting diodes are subdivided into first light-emitting diodes and second light-emitting diodes, and a conversion element configured to absorb light emitted by the light-emitting diodes and generate converted light with a longer wavelength than the emitted light, wherein the conversion element includes a first luminescent conversion material in a first matrix material, the first matrix material with the first luminescent conversion material is arranged two-dimensionally in a continuous layer above the first and second light-emitting diodes, the conversion element includes a second luminescent conversion material in a second matrix material, the second matrix material with the second luminescent conversion material is arranged only above the second light-emitting diodes, the arrangement of light-emitting diodes includes third light-emitting diodes, the conversion element includes a third matrix material with a third luminescent conversion material in the region of the third light-emitting diodes, the light emitted by the third light-emitting diodes can be converted by the first luminescent conversion material in the first matrix material and the luminescent conversion material in the third matrix material into white light with a third color temperature.

LIST OF REFERENCES

100 white light source
110 arrangement of light-emitting diodes
111 first light-emitting diode
112 second light-emitting diode 113 column
114 row
115 first column
116 second column
117 first row
118 second row
119 further odd row
120 further even row
121 first matrix material with first luminescent conversion material
122 second matrix material with second luminescent conversion material
123 conversion element
124 transmission element
125 third light-emitting diodes
126 third matrix material with third luminescent conversion material
130 carrier

DETAILED DESCRIPTION

Our white light source comprises an arrangement of light-emitting diodes. The light-emitting diodes are subdivided into first light-emitting diodes and second light-emitting diodes. In this example, the first light-emitting diodes and the second light-emitting diodes may be identical or different in terms of structure. Furthermore, the white light source comprises a conversion element configured to absorb light emitted by the light-emitting diodes and generate converted light with a longer wavelength than the emitted light. The conversion element comprises a first luminescent material in a first matrix material. In this example, the first matrix material with the first luminescent conversion material is arranged two-dimensionally above the first and second light-emitting diodes in a continuous layer. The conversion element further comprises a second luminescent conversion material in a second matrix material, the second matrix material with the second luminescent conversion material being arranged above the second light-emitting diodes. The light of the first light-emitting diodes thus strikes the first luminescent conversion material in the first matrix material, while the light of the second light-emitting diodes strikes both luminescent conversion materials in both matrix materials. In this way, different spectra of the converted light can be generated by the first light-emitting diodes and second light-emitting diodes, respectively.

The first luminescent conversion material may be configured to convert light emitted by the first light-emitting diodes into white light with a first color temperature. Light emitted by the second light-emitting diodes can be converted by the first luminescent conversion material in the first matrix material and the second luminescent conversion material in the second matrix material into white light with a second color temperature. The white light source therefore emits white light with the first color temperature in the region of the first light-emitting diodes and white light with the second color temperature in the region of the second light-emitting diodes.

The first color temperature may differ from the second color temperature by at least 500 kelvin, preferably by more than 1000 kelvin, and particularly preferably by more than 2000 kelvin. This may be made possible in particular by selection of the first luminescent conversion material and the second luminescent conversion material, but may also be reinforced by selection of the light-emitting diodes, if the first and second light-emitting diodes are intended to be different.

The first color temperature may be higher than the second color temperature.

The first matrix material with the first luminescent conversion material may be arranged two-dimensionally on the arrangement of light-emitting diodes. The second matrix material with the second luminescent conversion material may be arranged above the first matrix material in the form of a plurality of two-dimensional elements. The two-dimensional elements are in this example arranged above the second light-emitting diodes, the light emitted by the second light-emitting diodes striking initially the first luminescent conversion material and subsequently the second luminescent conversion material, and a part of the light of the second light-emitting diodes respectively being converted by the first or second luminescent conversion material.

The second matrix material with the second luminescent conversion material may be arranged on the second light-emitting diodes. The first matrix material with the first luminescent conversion material may be arranged on the first light-emitting diodes and above the second light-emitting diodes on the second matrix material. The light emitted by the second light-emitting diodes thus strikes initially the second luminescent conversion material and subsequently the first luminescent conversion material. A part of the light of the second light-emitting diodes is respectively converted by the first or second luminescent conversion material.

The first light-emitting diodes and the second light-emitting diodes may be configured to be drivable independently of one another. Then, an intensity of the light emitted by the first light-emitting diodes or the second light-emitting diodes may respectively be selected independently of one another. In this way, a color temperature of the white light source overall may be adjusted, the adjusted color temperature lying between the first and second color temperature. The white light source is thus variable in its color impression.

The first light-emitting diodes and the second light-emitting diodes can respectively be driven individually on their own. This allows a white light source whose color temperature can be adjusted differently in different regions of the white light source. This allows, for example, lighting of a stage setting with different color nuances of the white light. Another application would be lighting an object to be photographed and a background with white light, the color temperature being adapted to the environment or the object being illuminated with a different color temperature than the background.

The light-emitting diodes may be arranged in first columns and second columns. This provides an arrangement of the light-emitting diodes that is simple to produce.

The first light-emitting diodes may be arranged in first columns and the second light-emitting diodes may be arranged in second columns. This leads to simple production since large connected regions can be covered with the second matrix material with the second luminescent conversion material.

First light-emitting diodes and second light-emitting diodes may be arranged alternately in a first row, beginning with a first light-emitting diode. First light-emitting diodes and second light-emitting diodes are arranged alternately in a second row beginning with a second light-emitting diode. Further, odd rows correspond to the first row and further even rows correspond to the second row. This provides a checkerboard-like arrangement of the first and second light-emitting diodes and a maximally homogeneous color impression of the white light source since each first light-emitting diode is adjacent only to second light-emitting diodes, and each second light-emitting diode is adjacent only to first light-emitting diodes. An additional optical structure may be provided that reinforces the homogeneous color impression of the white light source.

The first and second light-emitting diodes may be arranged in the manner of a checkerboard, the light-emitting diodes respectively having a distance from one another.

Arrangement of light-emitting diodes may comprise third light-emitting diodes. The conversion element comprises a third matrix material with a third luminescent conversion material in the region of the third light-emitting diodes. By virtue of the third luminescent conversion material in the third matrix material, white light with a further spectral distribution may be generated.

The light emitted by the third light-emitting diodes can be converted by the first luminescent conversion material in the first matrix material and the luminescent conversion material in the third matrix material into white light with a third color temperature. This provides a white light source whose color temperature can be controlled more simply overall.

The conversion element additionally may comprise the second matrix material with the second luminescent conversion material in the region of the third light-emitting diodes.

The light emitted by the third light-emitting diodes can be converted by the first luminescent conversion material in the first matrix material, the second luminescent conversion material in the second matrix material and the third luminescent conversion material in the third matrix material into white light with a third color temperature. This provides a white light source whose color temperature can be controlled more simply overall.

The third light-emitting diodes can respectively be driven individually on their own. This may, in particular, be advantageous when the first light-emitting diodes and the second light-emitting diodes can also be driven individually on their own.

The first light-emitting diodes may be arranged in first columns, the second light-emitting diodes may be arranged in second columns and the third light-emitting diodes may be arranged in third columns Our method of producing a white light source may comprise the steps:

providing an arrangement of light-emitting diodes, wherein the light-emitting diodes inside the arrangement are subdivided into first light-emitting diodes and into second light-emitting diodes;

two-dimensional application of a first matrix material with a first luminescent conversion material onto the arrangement of light-emitting diodes; and application of a second matrix material with a second luminescent conversion material above the second light-emitting diodes.

The first matrix material with the first luminescent conversion material may be applied first. Consequently, the second matrix material with the second luminescent conversion material is applied above the first matrix material.

The second matrix material with the second luminescent conversion material may be applied first to the second light-emitting diodes. Consequently, the first matrix material with the first luminescent conversion material is applied above the second matrix material above the second light-emitting diodes and above the first light-emitting diodes.

Third light-emitting diodes may additionally be provided inside the arrangement of light-emitting diodes. As an additional step, a third matrix material with a third luminescent conversion material is applied above the third light-emitting diodes.

The above-described properties, features and advantages, and the way in which they are achieved, will become more clearly and readily comprehensible in conjunction with the following description of examples, which will be explained in more detail in connection with the drawings, respectively, a schematized representation.

Figure 1:
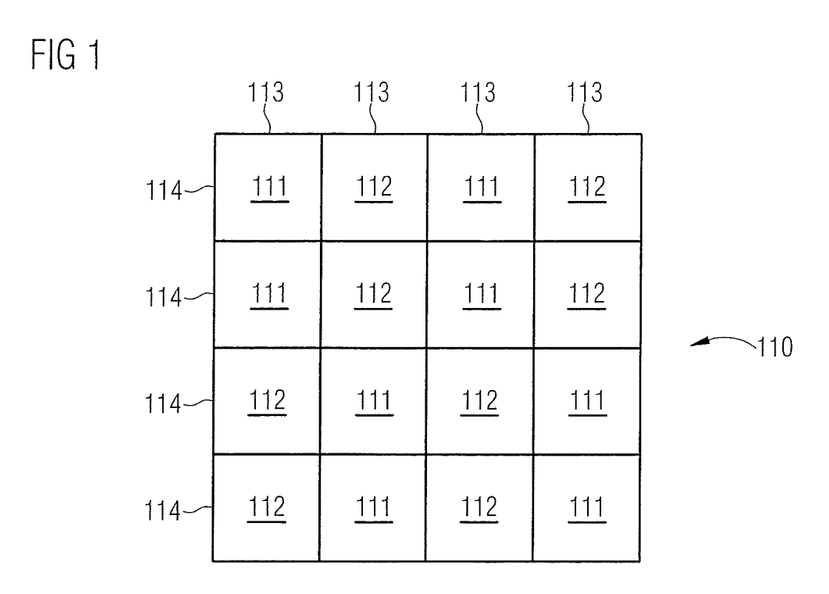
FIG. 1 shows a plan view of an arrangement of light-emitting diodes for a white light source.

FIG. 1 shows a plan view of an arrangement 110 of light-emitting diodes 111, 112. The light-emitting diodes 111, 112 are in this example arranged in columns 113 and rows 114. The arrangement 110 in this example comprises sixteen light-emitting diodes 111, 112 in respectively four columns 113 and rows 114. The arrangement 110 can, however, also comprise a different number of light-emitting diodes 111, 112 arranged in more or fewer columns 113 or rows 114. The light-emitting diodes 111, 112 are subdivided into first light-emitting diodes 111 and second light-emitting diodes 112. Respectively, two first light-emitting diodes 111 and two second light-emitting diodes 112 are arranged in each column 113, the first light-emitting diodes 111 and the second light-emitting diodes 112 respectively are arranged next to one another. In each row 114, the first light-emitting diodes 111 and the second light-emitting diodes 112 are arranged alternately. Each first light-emitting diode 111 is thus adjacent to one further first light-emitting diode 111 and apart from that to second light-emitting diodes 112. Each second light-emitting diode 112 is adjacent to one further second light-emitting diode 112 and apart from that to first light-emitting diodes 111.

A different number of columns 113 and rows 114 may be provided so that there is also a different number of light-emitting diodes 111, 112. For example, a few hundred columns 113 and rows 114 may also be provided that are, respectively, arranged in a similar way to the arrangement 110 in FIG. 1. For example, the arrangement may comprise 2500 light-emitting diodes 111, 112.

Figure 2:
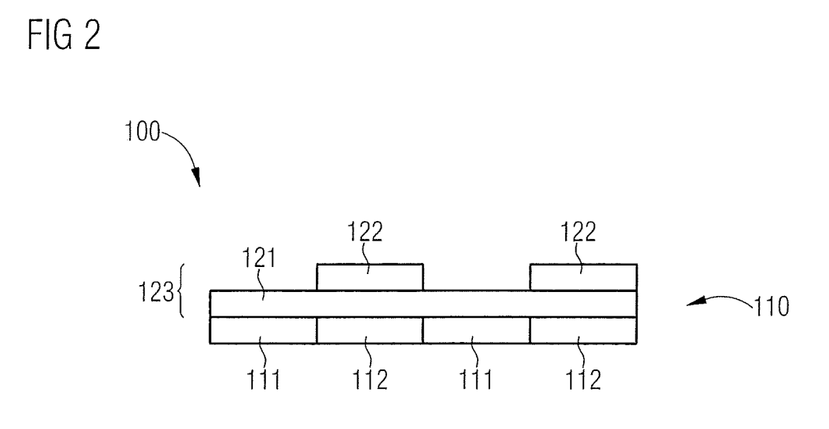
FIG. 2 shows a cross section through a white light source.

FIG. 2 represents a cross section through a white light source 100 having the arrangement of light-emitting diodes 111, 112 of FIG. 1. In this example, the cross section extends through a row 114 of the light-emitting diodes 111, 112 of FIG. 1 so that in the cross section respectively first light-emitting diodes 111 and second light-emitting diodes 112 are arranged alternately. Arranged above the light-emitting diodes 111, 112, there is a conversion element 123. The conversion element 123 is configured to absorb the light emitted by the light-emitting diodes 111, 112 and to generate converted light with a longer wavelength than the light emitted by the light-emitting diodes 111, 112. The conversion element 123 in this example comprises a first matrix material 121 with a first luminescent conversion material. The first matrix material 121 with the first luminescent conversion material is in this example arranged two-dimensionally on the entire arrangement 110 of light-emitting diodes 111, 112, and is adjacent both to the first light-emitting diodes 111 and to the second light-emitting diodes 112. The first matrix material 121 with the first luminescent conversion material is in this example configured as a continuous layer.

The conversion element 123 further comprises a second matrix material 122 with a second luminescent conversion material, the second matrix material 122 with the second luminescent conversion material being arranged above the second light-emitting diodes 112 but not above the first light-emitting diodes 111. The second matrix material 122 with a second luminescent conversion material is arranged above the first matrix material 121 with a first luminescent conversion material.

The light emitted by the first light-emitting diodes 111 is thus converted inside the first matrix material 121 by the first luminescent conversion material. The light emitted by the second light-emitting diodes 112 is converted inside the first matrix material 121 by the first luminescent conversion material and inside the second matrix material 122 by the second luminescent conversion material.

The first light-emitting diodes 111 may in this example correspond in terms of structure to the second light-emitting diodes 112 or be different to the second light-emitting diodes 112.

The first luminescent conversion material may be configured to convert light emitted by the first light-emitting diodes 111 into white light with a first color temperature. Light emitted by the second light-emitting diodes 112 may be converted by the first luminescent conversion material and the second luminescent conversion material into white light with a second color temperature.

The first color temperature and the second color temperature may differ by at least 500 kelvin, preferably by more than 1000 kelvin, and particularly preferably by more than 2000 kelvin. For example, the first color temperature is higher than the second color temperature. A higher color temperature corresponds to white light with a greater blue component, while a lower color temperature corresponds to white light with a greater red component. The light-emitting diodes 111, 112 may, for example, be blue light-emitting diodes. A part of the light emitted by the light-emitting diodes 111, 112 is converted by the first luminescent conversion material in the first matrix material 121, for example, into yellow light to obtain white light with a relatively large blue component overall. A part of the remaining blue light component emitted by the second light-emitting diodes 112 is then converted by the second luminescent conversion material in the second matrix material 122 likewise into yellow light or into red light so that overall white light is formed with a greater red component than the white light formed only because of the conversion by the first luminescent conversion material in the first matrix material 121. The effect is similar when the second matrix material 122 with the second luminescent conversion material is arranged below the first matrix material 121 with the first luminescent conversion material above the second light-emitting diodes 112. As a result of this, the first color temperature is higher than the second color temperature.

In particular, it is possible both that the first light-emitting diodes 111 and the second light-emitting diodes 112 are identical, and also that the first luminescent conversion material and the second luminescent conversion material correspond and the different color temperature results from the increased absorption of the light emitted by the second light-emitting diodes 112 both in the first and in the second luminescent conversion material, and the concomitant increased conversion into light with a longer wavelength.

Figure 3:
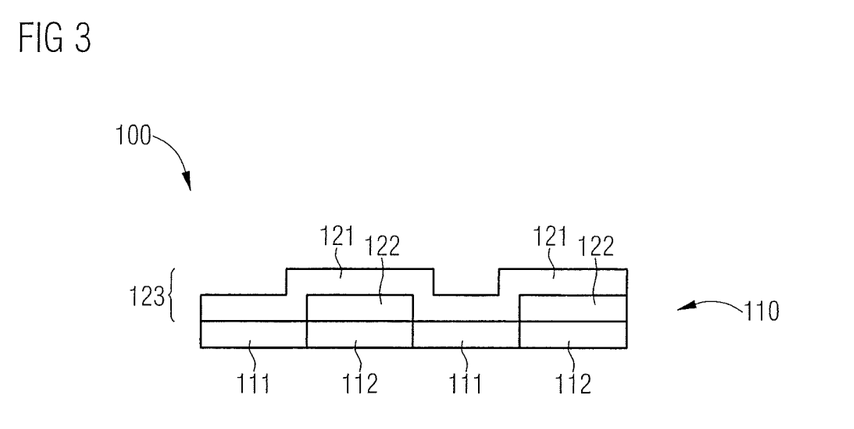
FIG. 3 shows a further cross section through a white light source.

FIG. 3 shows a cross section through a white light source 100 in which the conversion element 123 is constructed differently than in FIG. 2. The first light-emitting diodes 111 and the second light-emitting diodes 112 correspond to those of FIG. 2. A second matrix material 122 with a second luminescent conversion material is arranged directly on the second light-emitting diodes 112. A first matrix material 121 with a first luminescent conversion material is arranged above the first light-emitting diodes 111 and above the second matrix material 122 with the second luminescent conversion material in a continuous layer.

The white light sources 100 of FIGS. 2 and 3 thus differ by the matrix material 121, 122 that has been applied first onto the arrangement 110 of the light-emitting diodes 111, 112.

Figure 4:
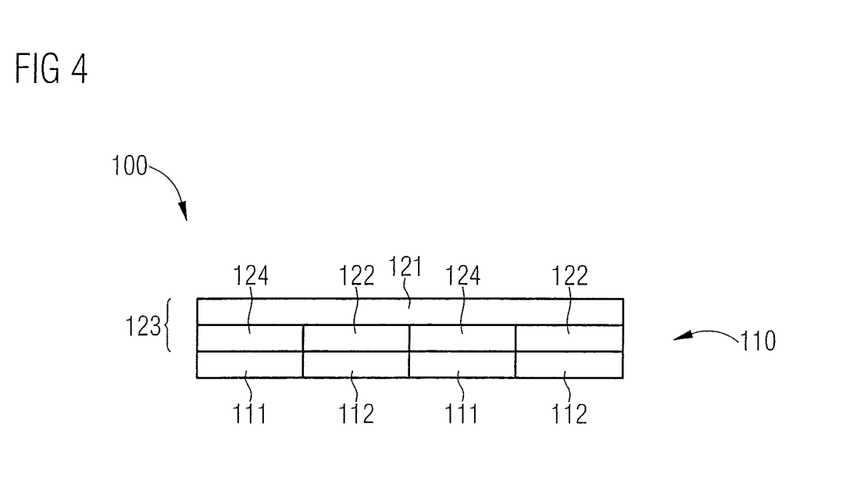
FIG. 4 shows a further cross section through a white light source.

FIG. 4 shows a further cross section through a white light source 100 corresponding essentially to the white light source of FIG. 3. Arranged above the first light-emitting diodes 111 there is, respectively, a transmission element 124 having an identical height to the second matrix material 122 with the second luminescent conversion material. The first matrix material 121 with the first luminescent conversion material is arranged above the second matrix material 121 and above the transmission elements 124 in a continuous layer.

The conversion elements of FIGS. 2 to 4 may respectively be combined with the arrangement 110 of the light-emitting diodes 111, 112 of FIG. 1.

The first matrix material 121 with the first luminescent conversion material may in this example be applied for FIGS. 2 to 4 in the form of a spray coating, as a printed layer, by electrophoretic deposition, as an injection-molded body or as a film. The second matrix material 122 with the second luminescent conversion material may be a ceramic platelet of luminescent conversion material or a sintered platelet of luminescent conversion material. It is likewise possible for the second matrix material 122 to be printed with the second luminescent conversion material.

Figure 5:
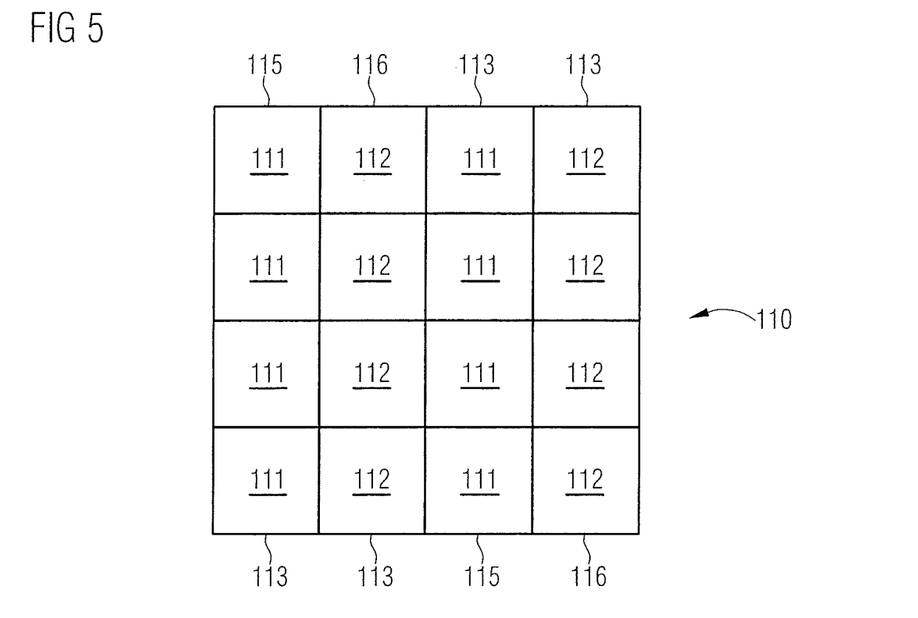
FIG. 5 shows a plan view of a further arrangement of light-emitting diodes for a white light source.

FIG. 5 shows a plan view of a further arrangement 110 of first and second light-emitting diodes 111, 112 arranged in columns 113. In this example, the columns 113 are subdivided into first columns 115 and second columns 116, first columns 115 and second columns 116 respectively alternating. First light-emitting diodes 111 are respectively arranged in the first columns 115. Second light-emitting diodes 112 are respectively arranged in the second columns 116.

Figure 6:
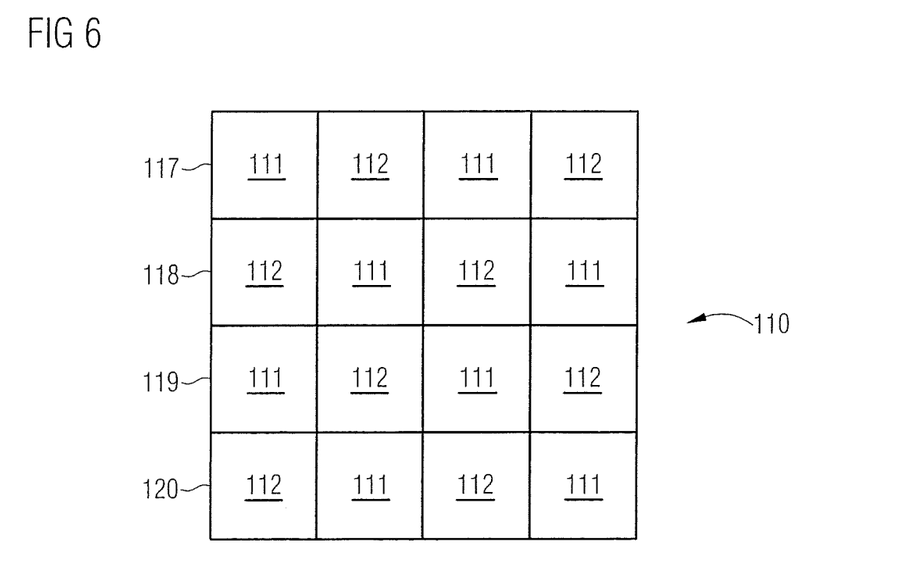
FIG. 6 shows a plan view of a further arrangement of light-emitting didoes for a white light source.

FIG. 6 shows a plan view of a further arrangement 110 of first and second light-emitting diodes 111, 112. In a first row 117, first light-emitting diodes 111 and second light-emitting diodes 112 are arranged alternately, beginning with a first light-emitting diode 111. In a second row 118, first light-emitting diodes 111 and second light-emitting diodes 112 are arranged alternately, beginning with a second light-emitting diode 112. A further odd row 119 corresponds to the first row 117. A further even row 120 corresponds to the second row 118. The arrangement 110 of the light-emitting diodes is thus in the manner of a checkerboard. This means that each first light-emitting diode 111 is adjacent only to second light-emitting diodes 112, and each second light-emitting diode 112 is adjacent only to first light-emitting diodes 111, in a similar way to the arrangement of the white and black squares of a checkerboard.

A conversion element 123 similar to FIGS. 2 to 4 is provided above the arrangement 110 of light-emitting diodes 111, 112 of FIGS. 5 and 6, the first matrix material 121 with the first luminescent conversion material being arranged above the first light-emitting diodes 111, and both the first matrix material 121 with the first luminescent conversion material and the second matrix material 122 with the second luminescent conversion material being provided above the second light-emitting diodes 112.

The arrangements 110 of FIG. 5 or 6 may likewise comprise more than the number of light-emitting diodes 111, 112 shown in FIG. 5 or 6, in particular up to a few hundred columns 113 or rows 114.

The first light-emitting diodes 111 and the second light-emitting diodes 112 can respectively be driven individually on their own.

The differences between the first color temperature and the second color temperature result from the fact that the first matrix material 121 with the first luminescent conversion material is arranged above the first light-emitting diodes 111, and both the first matrix material 121 with the first luminescent conversion material and the second matrix material 122 with the second luminescent conversion material are arranged above the second light-emitting diodes 112. In this example, the matrix materials 121, 122 may differ from one another or be identical. The luminescent conversion materials may likewise be different or identical, in identical luminescent conversion materials the differences in the color temperature resulting from the fact that the light of the second light-emitting diodes 112 covers a greater distance inside the luminescent conversion material than the light of the first light-emitting diodes 111.

A further possibility of obtaining different color temperatures is for the first light-emitting diodes 111 to be different in design than the second light-emitting diodes 112.

The white light source 100 of FIGS. 2 to 4 may be produced by applying a first matrix material 121 with a first luminescent conversion material onto the arrangement 110 of light-emitting diodes 111, 112, and a second matrix material 122 with a second luminescent conversion material above the second light-emitting diodes 112.

If the first matrix material 121 with the first luminescent conversion material is applied first, a white light source 100 as represented in FIG. 2 is in this example obtained. If the second matrix material 122 with the second luminescent conversion material is applied first, a white light source 100 as represented in FIG. 3 is in this example obtained. After the application of the second matrix material 122 with the second luminescent conversion material, the transmission element 122 of FIG. 4 may optionally be applied above the first light-emitting diodes, before the first matrix material 121 with the first luminescent conversion material is applied.

The first matrix material 121 with the first luminescent conversion material may in this example be applied in the form of a spray coating, as a printed layer, by the electrophoretic deposition, as an injection-molded body or as a film. The second matrix material 122 with the second luminescent conversion material may be a ceramic platelet of luminescent conversion material or a sintered platelet of luminescent conversion material. It is likewise possible for the second matrix material 122 to be printed with the second luminescent conversion material.

The second matrix material 122 with the second luminescent conversion material may also initially be printed as platelets and only then subsequently applied, for example, by a pick-and-place method.

Figure 7:
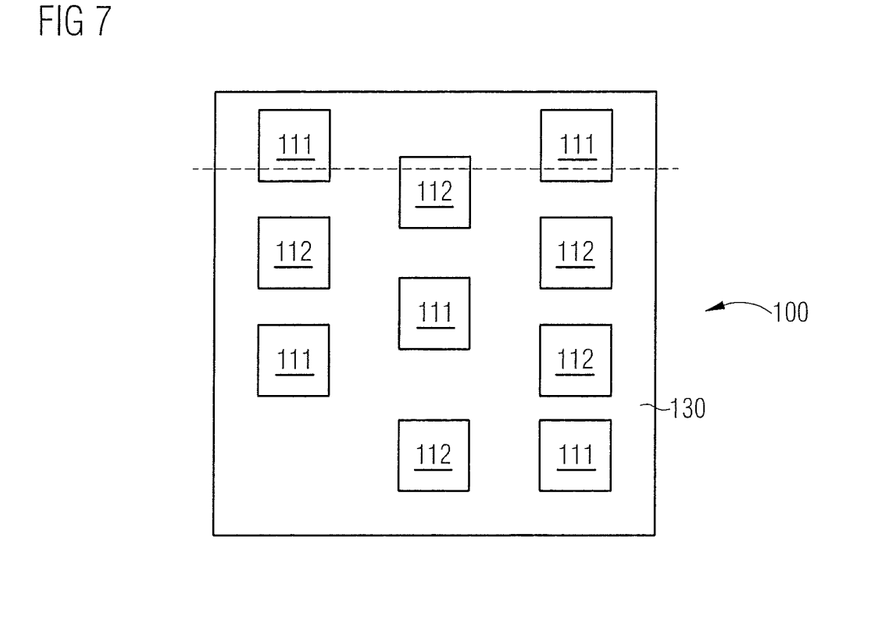
FIG. 7 shows a plan view of a further white light source.

FIG. 7 shows a plan view of a further white light source 100. The white light source 100 comprises first light-emitting diodes 111 and second light-emitting diodes 112 arranged irregularly on a carrier 130. The white light source 100 could, however, also comprise a different number of light-emitting diodes 111, 112.

Figure 8:
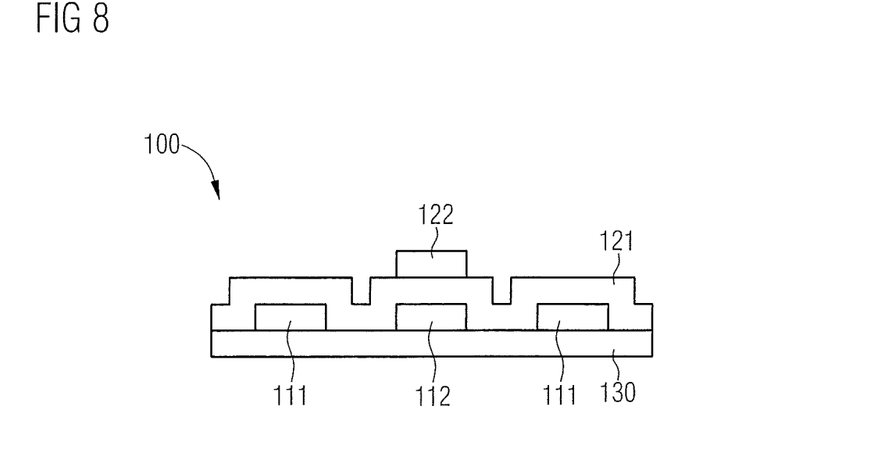
FIG. 8 shows a cross section through a further white light source.

FIG. 8 shows a cross section through the white light source 100 of FIG. 7, at the position denoted in FIG. 7 by a dashed line. A first matrix material 121 with a first luminescent conversion material is applied two-dimensionally on the carrier 130 with the first light-emitting diodes 111 and the second light-emitting diodes 112. A second matrix material 122 with a second luminescent conversion material is applied above the first matrix material 121 and above the second light-emitting diodes 112.

Figure 9:
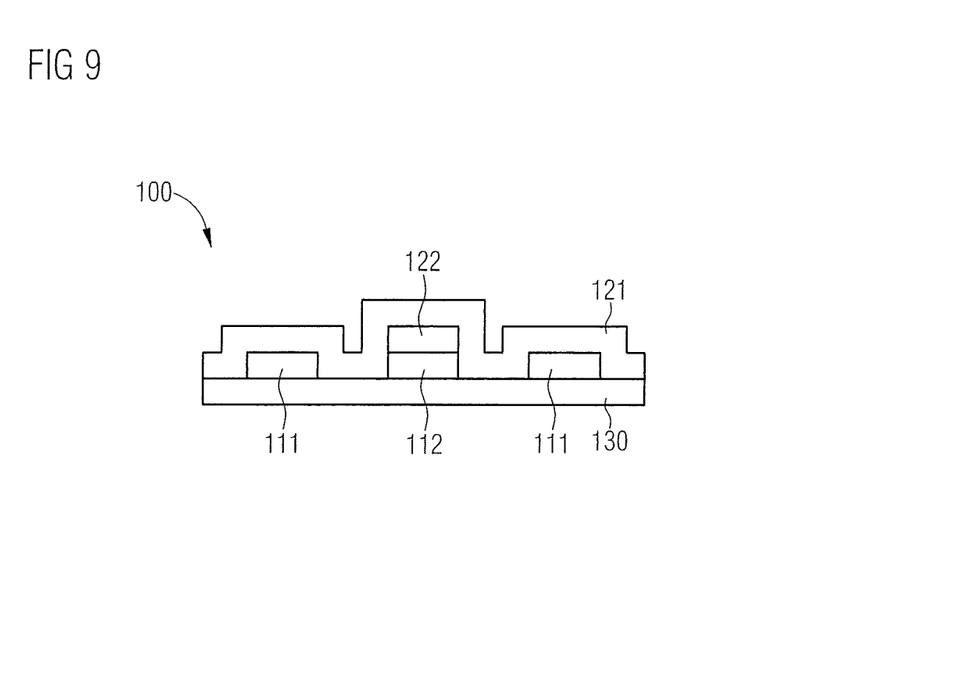
FIG. 9 shows a further cross section through a further white light source.

As an alternative to the cross section of FIG. 8, the white light source 100 may also be constructed as shown in the cross section of FIG. 9. The second matrix material 122 with the second luminescent conversion material is directly adjacent to the second light-emitting diodes 112, while the first matrix material 121 with the first luminescent conversion material is arranged in the region of the second light-emitting diodes 112 above the second matrix material 122.

Figure 10:
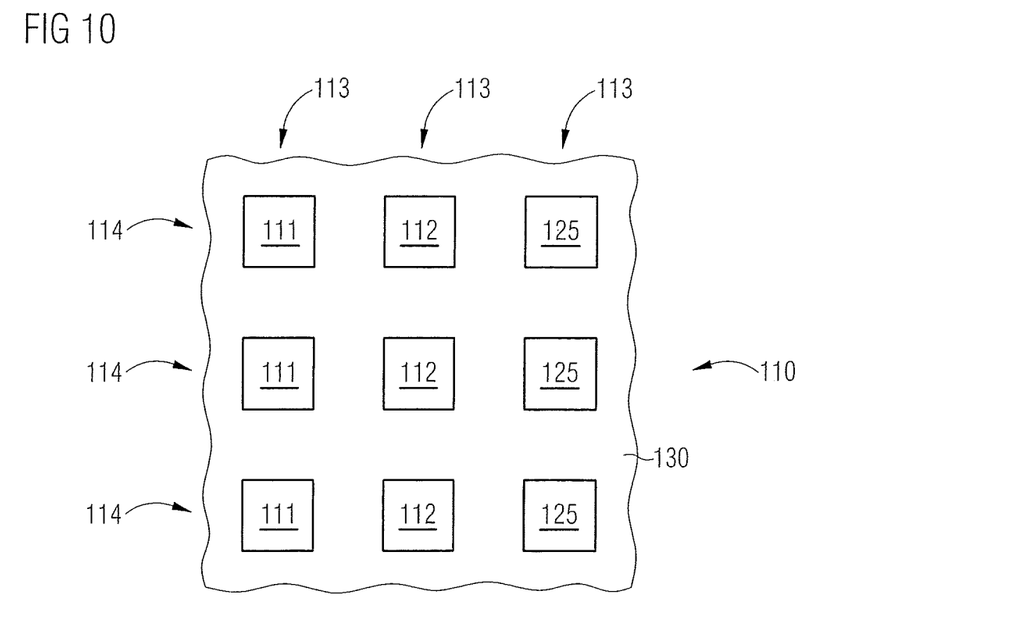
FIG. 10 shows a plan view of an arrangement of light-emitting diodes having first, second and third light-emitting diodes.

FIG. 10 shows a detail of an arrangement 110 of light-emitting diodes 111, 112, 125 on a carrier 130. The light-emitting diodes 111, 112, 125 are in this example subdivided into first light-emitting diodes 111, into second light-emitting diodes 112 and into third light-emitting diodes 125. The light-emitting diodes 111, 112, 125 are arranged at a distance from one another on the carrier 130. As an alternative, the light-emitting diodes 111, 112, 125 may be directly adjacent to one another. First light-emitting diodes 111, second light-emitting diodes 112 and third light-emitting diodes 125 are in this example respectively arranged in a row 114, while respectively only first light-emitting diodes 111 or second light-emitting diodes 112 or third light-emitting diodes 125 are respectively provided in the columns 113. A different arrangement of the light-emitting diodes 111, 112, 125 is likewise possible, for example, similarly to FIG. 7.

FIG. 10 shows only a detail of an arrangement 110 of light-emitting diodes 111, 112. 125, while in use in a white light source more columns 113 and rows 114 than shown in FIG. 10 may be provided.

Figure 11:
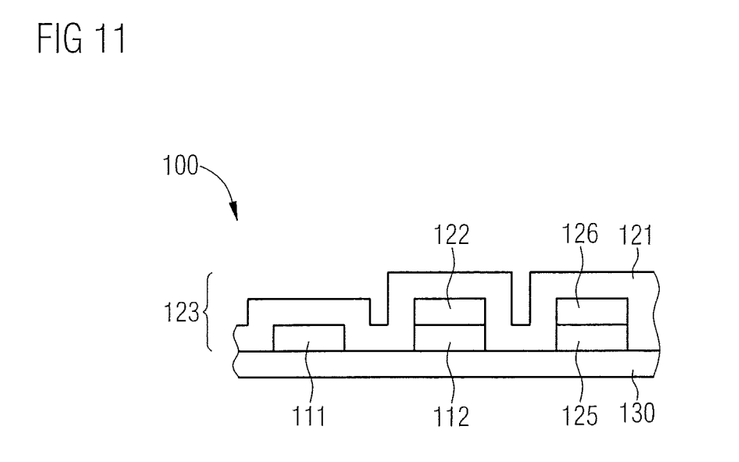
FIG. 11 shows a cross section through a further white light source.

FIG. 11 shows a cross section through a white light source 100 in which the light-emitting diodes 111, 112, 125 are arranged as shown in FIG. 10 on a carrier 130. A second matrix material 122 with a second luminescent conversion material, for example, in the form of a platelet, is arranged above the second light-emitting diodes 112. A third matrix material 126 with a third luminescent conversion material, for example, in the form of a platelet is arranged above the third light-emitting diodes 125.

The light emitted by the first light-emitting diodes 111 can be converted into white light with a first color temperature by the first luminescent conversion material in the first matrix material 121. The light emitted by the second light-emitting diodes 112 can be converted by the first luminescent conversion material in the first matrix material 121 and the second luminescent conversion material in the second matrix material 122 into white light with a second color temperature. The light emitted by the third light-emitting diodes 125 can be converted by the first luminescent conversion material in the first matrix material 121 and the third luminescent conversion material in the third matrix material 126 into white light with a third color temperature.

The first matrix material 121 with the first luminescent conversion material, the second matrix material 122 with the second luminescent conversion material and the third matrix material 126 with the third luminescent conversion material together form a conversion element 123.

Instead of the arrangement of the first matrix material 121 with the first luminescent conversion material, the second matrix material 122 with the second luminescent conversion material and the third matrix material 126 with the third luminescent conversion material shown in FIG. 11, an arrangement similar to FIG. 2 may also be provided in which the first matrix material 121 with the first luminescent conversion material with the first luminescent conversion material is adjacent to the light-emitting diodes 111, 112, 125 and the second matrix material 122 with the second luminescent conversion material and/or the third matrix material 126 with the third luminescent conversion material are respectively arranged above the first matrix material 121 with the first luminescent conversion material.

Figure 12:
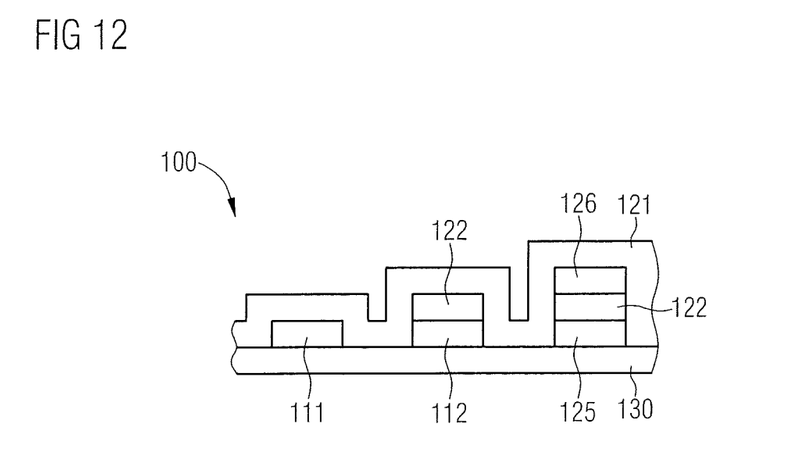
FIG. 12 shows a further cross section through a further white light source.

FIG. 12 shows a cross section through a white light source 100 in which a light-emitting diodes 111, 112, 125 are arranged as shown in FIG. 10 on a carrier 130. A second matrix material 122 with a second luminescent conversion material, for example, in the form of a platelet is arranged above the second light-emitting diodes 112. A second matrix material 122 with a second luminescent conversion material, for example, in the form of a platelet is arranged above the third light-emitting diodes 125, and a third matrix material 126 with a third luminescent conversion material, for example, in the form of a platelet is arranged above the second matrix material 122 with a second luminescent conversion material.

The light emitted by the first light-emitting diodes 111 can be converted by the first luminescent conversion material in the first matrix material 121 into white light with a first color temperature. The light emitted by the second light-emitting diodes 112 can be converted by the first luminescent conversion material in the first matrix material 121 and the second luminescent conversion material in the second matrix material 122 into white light with a second color temperature. The light emitted by the third light-emitting diodes 125 can be converted by the first luminescent conversion material in the first matrix material 121, the second luminescent conversion material in the second matrix material 122 and the third luminescent conversion material in the third matrix material 126 into white light with a third color temperature.

The first matrix material 121 with the first luminescent conversion material, the second matrix material 122 with the second luminescent conversion material and the third matrix material 126 with the third luminescent conversion material together form a conversion element 123.

Instead of the arrangement of the first matrix material 121 with the first luminescent conversion material, the second matrix material 122 with the second luminescent conversion material and the third matrix material 126 with the third luminescent conversion material as shown in FIG. 12, an arrangement similar to FIG. 2 may also be provided in which the first matrix material 121 with the first luminescent conversion material to the light-emitting diodes 111, 112, 125 and the second matrix material 122 with the second luminescent conversion material is arranged above the first matrix material 121 with the first luminescent conversion material, and the third matrix material 126 with the third luminescent conversion material is arranged above the second matrix material 122 with the second luminescent conversion material.

Figure 13:
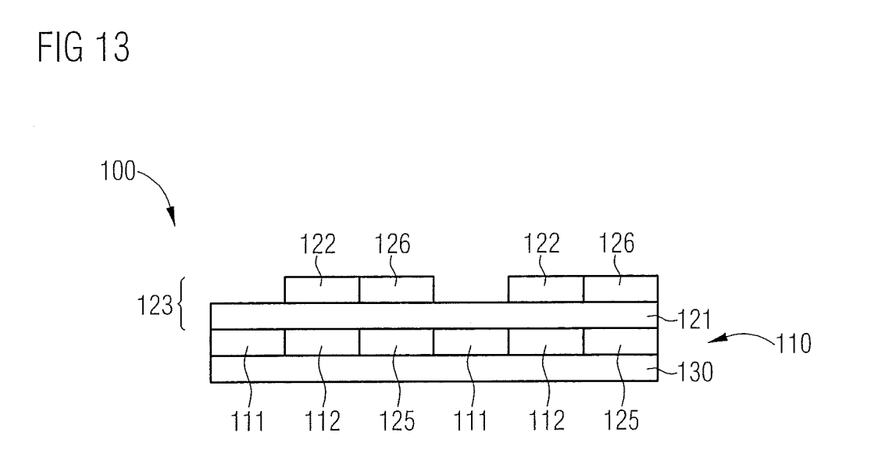
FIG. 13 shows a further cross section through a further white light source.

FIG. 13 shows a further cross section through a white light source 100 having an arrangement 110 of light-emitting diodes 111, 112, 125 on a carrier 130. The light-emitting diodes 111, 112, 125 are in this example directly adjacent to one another. A first matrix material 121 with a first luminescent conversion material is adjacent to the light-emitting diodes 111, 112, 125. A second matrix material 122 with a second luminescent conversion material is arranged above the second light-emitting diodes 112 on the first matrix material 121 with the first luminescent conversion material. A third matrix material 126 with a third luminescent conversion material is arranged above the third light-emitting diodes 125 adjacent to the first matrix material 121 with the first luminescent conversion material.

In a similar way to FIG. 12, the white light source of FIG. 13 may also comprise a second matrix material 122 with a second luminescent conversion material and a third matrix material 126 with a third luminescent conversion material above one another in the region of the third light-emitting diodes.

The second matrix material 122 with the second luminescent conversion material and the third matrix material 126 with the third luminescent conversion material may in this example be configured as platelets.

Conversion of the light emitted by the light-emitting diodes 111, 112, 125 is in this example carried out in a similar way to FIGS. 11 and 12.

Figure 14:
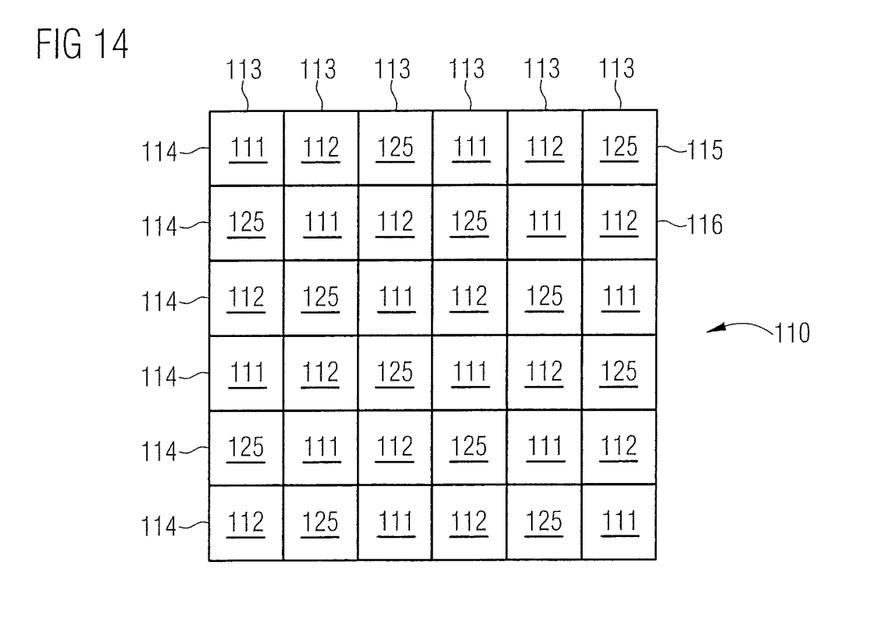
FIG. 14 shows a plan view of a further arrangement of light-emitting diodes.

FIG. 14 shows a further plan view of an arrangement 100 and of light-emitting diodes 111, 112, 125, in which the light-emitting diodes 111, 112, 125 are arranged in columns 113 and rows 114. Arranged in a first row 115 are, from left to right, a first light-emitting diode 111, next thereto a second light-emitting diode 112, next thereto a third light-emitting diode 125, next thereto another first light-emitting diode 111, next thereto another second light-emitting diode 112 and next thereto another third light-emitting diode 125. In a second row 116, the arrangement of light-emitting diodes 111, 112, 125 is shifted to the right by one position compared to the first row 115 so that the second row 116 begins with a third light-emitting diode 125. In each further row 114, the arrangement of the light-emitting diodes 111, 112, 125 is shifted to the right by a further position compared to the preceding row 114 so that after respectively three shifts the arrangement of the light-emitting diodes 111, 112, 125 again corresponds to the first row 115. This provides an arrangement of the light-emitting diodes 111, 112, 125 corresponding to the checkerboard-like arrangement of the light-emitting diodes of FIG. 6, for the examples in which three different color temperatures are provided.

Preferably silicones, ceramics or glasses may be provided as a first matrix material 121, as a second matrix material 122 and/or as a third matrix material 126.

The color temperatures typically vary from 1500 kelvin to 8000 kelvin.

Although our sources and methods have been illustrated and described in more detail with the aid of preferred examples, this disclosure is not restricted by the examples disclosed, and other variants may be derived therefrom by those skilled in the art without departing from the protective scope of the appended claims.

This application claims priority of DE 10 2016 124 873.8, the subject matter of which is incorporated herein by reference.

The invention claimed is:

1. A white light source comprising:
an arrangement of light-emitting diodes, wherein the light-emitting diodes are subdivided into first light-emitting diodes and second light-emitting diodes, and
a conversion element configured to absorb light emitted by the light-emitting diodes and generate converted light with a longer wavelength than the emitted light, wherein the conversion element comprises a first luminescent conversion material in a first matrix material, the first matrix material with the first luminescent conversion material is arranged two-dimensionally in a continuous layer above the first and second light-emitting diodes, the conversion element comprises a second luminescent conversion material in a second matrix material, and the second matrix material with the second luminescent conversion material is arranged only above the second light-emitting diodes, wherein the first luminescent conversion material is configured to convert light emitted by the first light-emitting diodes into white light with a first color temperature, and light emitted by the second light-emitting diodes can be converted by the first luminescent conversion material in the first matrix material and the second luminescent conversion material in the second matrix material into white light with a second color temperature, the arrangement of light-emitting diodes comprises third light-emitting diodes, and the conversion element comprises a third matrix material with a third luminescent conversion material in the region of the third light-emitting diodes, the conversion element additionally comprises the second matrix material with the second luminescent conversion material in a region of the third light-emitting diodes, and the light emitted by the third light-emitting diodes can be converted by the first luminescent conversion material in the first matrix material, the second luminescent conversion material in the second matrix material and the third luminescent conversion material in the third matrix material into white light with a third color temperature.

2. The white light source according to claim 1, wherein the first color temperature differs from the second color temperature by at least 500 Kelvin.

3. The white light source according to claim 1, wherein the first color temperature is higher than the second color temperature.

4. The white light source according claim 1, wherein the first matrix material with the first luminescent conversion material is arranged two-dimensionally on the arrangement of light-emitting diodes, and the second matrix material with the second luminescent conversion material is arranged above the first matrix material in the form of a plurality of two-dimensional elements.

5. The white light source according to claim 1, wherein the second matrix material with the second luminescent conversion material is arranged on the second light-emitting diodes, and the first matrix material with the first luminescent conversion material is arranged on the first light-emitting diodes and above the second light-emitting diodes on the second matrix material.

6. The white light source according to claim 1, wherein the first light-emitting diodes and the second light-emitting diodes can respectively be driven individually on their own.

7. The white light source according to claim 1, wherein the light-emitting diodes are arranged in columns and rows.

8. The white light source according to claim 7, wherein the first light-emitting diodes are arranged in first columns, and the second light-emitting diodes are arranged in second columns.

9. The white light source according to claim 7, wherein first light-emitting diodes and second light-emitting diodes are arranged alternately in a first row, beginning with a first light-emitting diode, first light-emitting diodes and second light-emitting diodes are arranged alternately in a second row, beginning with a second light-emitting diode, and further odd rows correspond to the first row and further even rows correspond to the second row.

10. The white light source according to claim 1, wherein the light emitted by the third light-emitting diodes can be converted by the first luminescent conversion material in the first matrix material and the luminescent conversion material in the third matrix material into white light with a third color temperature.

11. A method of producing the white light source according to claim 1, comprising:
providing an arrangement of light-emitting diodes, wherein the light-emitting diodes inside the arrangement are subdivided into first light-emitting diodes into second light-emitting diodes and into third light emitting diodes;
two-dimensional application of a first matrix material with a first luminescent conversion material onto the arrangement of light-emitting diodes;
application of a second matrix material with a second luminescent conversion material above the second light-emitting diodes, and
application of a third matrix material with a third luminescent conversion material above the third light-emitting diodes.

12. The method according to claim 11, wherein the first matrix material with the first luminescent conversion material is applied first.

13. The method according to claim 11, wherein the second matrix material with the second first luminescent conversion material is applied first.

14. A white light source comprising:
an arrangement of light-emitting diodes, wherein the light-emitting diodes are subdivided into first light-emitting diodes and second light-emitting diodes, and
a conversion element configured to absorb light emitted by the light-emitting diodes and generate converted light with a longer wavelength than the emitted light, wherein the conversion element comprises a first luminescent conversion material in a first matrix material, the first matrix material with the first luminescent conversion material is arranged two-dimensionally in a continuous layer above the first and second light-emitting diodes, the conversion element comprises a second luminescent conversion material in a second matrix material, the second matrix material with the second luminescent conversion material is arranged only above the second light-emitting diodes, the arrangement of light-emitting diodes comprises third light-emitting diodes, the conversion element comprises a third matrix material with a third luminescent conversion material in the region of the third light-emitting diodes, the light emitted by the third light-emitting diodes can be converted by the first luminescent conversion material in the first matrix material and the luminescent conversion material in the third matrix material into white light with a third color temperature.

15. The method according to claim 11, wherein the first matrix material is applied two-dimensionally in a continuous layer above the first, second and third light-emitting diodes, wherein the second matrix material is applied above the second light emitting diodes, and wherein the third matrix material is applied above the third light emitting diodes.

16. The method according to claim 15, wherein the second matrix material is also applied above the third light emitting diodes.

17. The method according to claim 16, wherein the first luminescent conversion material is configured to convert light emitted by the first light-emitting diodes into white light with a first color temperature, and light emitted by the second light-emitting diodes can be converted by the first luminescent conversion material in the first matrix material and the second luminescent conversion material in the second matrix material into white light with a second color temperature and wherein light emitted by the third light-emitting diodes can be converted by the first luminescent conversion material in the first matrix material, the second luminescent conversion material in the second matrix material and the third luminescent conversion material in the third matrix material into white light with a third color temperature.

18. The method according to claim 15, wherein the first luminescent conversion material is configured to convert light emitted by the first light-emitting diodes into white light with a first color temperature, and light emitted by the second light-emitting diodes can be converted by the first luminescent conversion material in the first matrix material and the second luminescent conversion material in the second matrix material into white light with a second color temperature and wherein the light emitted by the third light-emitting diodes can be converted by the first luminescent conversion material in the first matrix material and the luminescent conversion material in the third matrix material into white light with a third color temperature.

* * * * *